US011613102B2

(12) United States Patent
Murakami et al.

(10) Patent No.: US 11,613,102 B2
(45) Date of Patent: Mar. 28, 2023

(54) LAMINATE SHEET

(71) Applicant: SEKISUI CHEMICAL CO., LTD., Osaka (JP)

(72) Inventors: Junnosuke Murakami, Aichi (JP); Hideki Hayashi, Osaka (JP); Tomotaka Kojima, Aichi (JP); Mayumi Yukawa, Osaka (JP); Morio Takizawa, Aichi (JP); Motohiko Asano, Osaka (JP); Masaaki Kino, Aichi (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 16/970,134

(22) PCT Filed: Feb. 21, 2019

(86) PCT No.: PCT/JP2019/006444
§ 371 (c)(1),
(2) Date: Aug. 14, 2020

(87) PCT Pub. No.: WO2019/163863
PCT Pub. Date: Aug. 29, 2019

(65) Prior Publication Data
US 2020/0398532 A1    Dec. 24, 2020

(30) Foreign Application Priority Data

Feb. 22, 2018  (JP) .............................. JP2018-029519
Feb. 22, 2018  (JP) .............................. JP2018-029520

(51) Int. Cl.
*B32B 27/04*    (2006.01)
*B32B 15/14*    (2006.01)

(52) U.S. Cl.
CPC .............. *B32B 15/14* (2013.01); *B32B 27/04* (2013.01); *B32B 2250/03* (2013.01); *B32B 2260/023* (2013.01); *B32B 2262/106* (2013.01); *B32B 2307/40* (2013.01); *B32B 2307/732* (2013.01); *B32B 2311/18* (2013.01); *B32B 2311/22* (2013.01); *B32B 2311/24* (2013.01); *B32B 2313/02* (2013.01); *B32B 2313/04* (2013.01); *B32B 2605/08* (2013.01); *B32B 2605/18* (2013.01)

(58) Field of Classification Search
CPC ................ B32B 15/14; B32B 2250/03; B32B 2260/023; B32B 2262/106; B32B 2307/40; B32B 2307/732; B32B 2311/18; B32B 2311/22; B32B 2311/24; B32B 2313/02; B32B 2313/04; B32B 2605/08; B32B 2605/18; B32B 27/04; D06M 11/00
See application file for complete search history.

(56) References Cited

U.S. PATENT DOCUMENTS

| | | | |
|---|---|---|---|
| 4,500,602 A * | 2/1985 | Patten | ..................... C04B 41/89 428/408 |
| 4,927,683 A | 5/1990 | Tsutsui | |
| 2005/0221707 A1 | 10/2005 | Suzuki et al. | |
| 2014/0045060 A1* | 2/2014 | Park | ..................... H01M 4/386 429/211 |
| 2016/0118252 A1* | 4/2016 | Ishihara | ............ H01L 21/02623 438/479 |
| 2016/0251749 A1 | 9/2016 | Wu et al. | |
| 2017/0363777 A1 | 12/2017 | Maeda et al. | |
| 2020/0247088 A1 | 8/2020 | Murukami et al. | |

FOREIGN PATENT DOCUMENTS

| | | |
|---|---|---|
| CN | 107206742 | 9/2017 |
| EP | 0 731 206 | 9/1996 |
| JP | 61-132676 | 6/1986 |
| JP | 62-174701 | 7/1987 |
| JP | 63-12761 | 1/1988 |
| JP | 63-282367 | 11/1988 |
| JP | 3-082881 | 4/1991 |
| JP | 06-2270 | 1/1994 |
| JP | 06-123069 | 5/1994 |
| JP | 7-252769 | 10/1995 |
| JP | 07-252773 | 10/1995 |
| JP | 9-201896 | 8/1997 |
| JP | 11-172579 | 6/1999 |
| JP | 2003-313771 | 11/2003 |
| JP | 3137615 | 11/2007 |
| JP | 2010-229587 | 10/2010 |
| JP | 2016-159615 | 9/2016 |
| TW | 200726799 | 7/2007 |

(Continued)

OTHER PUBLICATIONS

International Search Report dated May 28, 2019 in International (PCT) Application No. PCT/JP2019/006444.
Notice of Reasons for Refusal dated May 28, 2019 in corresponding Japanese Application No. 2019-521162, with English machine translation.
Supplementary Extended European Search Report dated Nov. 30, 2021, in corresponding European Patent Application No. 19758228.1.
L. Aggour et al.: "Chemical Vapour Deposition of Pyro-Carbon, SiC, TiC, TiN, Si and Ta on Different Types of Carbon Fibres", Carbon, Elsevier Oxford, GB, vol. 12, No. 3, Jun. 1, 1974, pp. 358-362.
Office Action dated Mar. 16, 2022, in corresponding Chinese Patent Application No. 201980013515.6, with English translation.

*Primary Examiner* — Lawrence D Ferguson
(74) *Attorney, Agent, or Firm* — Wenderoth, Lind & Ponack, L.L.P.

(57) ABSTRACT

An object is to provide a coloring technique that makes it possible to impart luster while providing a vivid color, and further to provide a coloring technique that makes it possible to retain more unevenness when a substrate has unevenness. This object is achieved by a laminated sheet comprising a fiber substrate and a metalloid element-containing layer disposed on or above the surface of the fiber substrate.

17 Claims, No Drawings

(56) References Cited

FOREIGN PATENT DOCUMENTS

| WO | 2014/034268 | 3/2014 |
| WO | 2015/076802 | 5/2015 |
| WO | 2019/031589 | 2/2019 |

* cited by examiner

LAMINATE SHEET

TECHNICAL FIELD

The present invention relates to a laminated sheet and the like.

BACKGROUND ART

Fiber substrates are used in various fields where designability is required. For example, a carbon fiber substrate forms a composite material (e.g., a carbon fiber-reinforced plastic) together with a resin, and such composite materials are widely used in applications ranging from relatively large items such as aircraft bodies; to relatively small and familiar items such as sporting goods, and car interior and exterior materials. The carbonaceous substrate used may thus be colored to enhance its designability.

Carbonaceous substrates have been commonly colored by applying a paint containing a dye, a pigment, or the like (Patent Literature 1).

CITATION LIST

Patent Literature

PTL 1: JP2010-229587A

SUMMARY OF INVENTION

Technical Problem

The present inventor focused on the fact that when a fiber substrate is colored with a paint, for example, optical characteristics such as luster, which are visually recognized, and the unevenness of the fiber substrate in the case where the fiber substrate has unevenness, are deteriorated. These are all important factors relating to designability; however, the designability is rather deteriorated by coloring.

Regarding coloring, a technique for obtaining a more vivid color is desired, from the viewpoint of designability.

An object of the present invention is to provide a coloring technique that makes it possible to impart luster while providing a vivid color. Another object of the present invention is to provide a coloring technique that makes it possible to retain more unevenness when a substrate has unevenness. Preferably, it is also an object of the present invention to provide a coloring technique that makes it possible to retain more unevenness of a fiber substrate, impart luster, and provide a more vivid color.

Solution to Problem

The present inventor conducted extensive research, and found that the above objects can be achieved by a laminated sheet comprising a fiber substrate and a metalloid element-containing layer disposed on or above the surface of the fiber substrate. The present inventor conducted further research based on this finding, and accomplished the present invention.

Specifically, the present invention includes the following embodiments.

Item 1. A laminated sheet comprising a fiber substrate and a metalloid element-containing layer disposed on or above a surface of the fiber substrate.

Item 2. The laminated sheet according to Item 1, wherein the fiber substrate is a carbonaceous substrate.

Item 3. The laminated sheet according to Item 1 or 2, wherein the metalloid element constituting the metalloid element-containing layer is at least one member selected from the group consisting of silicon, germanium, antimony, tellurium, boron, phosphorus, bismuth, and selenium.

Item 4. The laminated sheet according to any one of Items 1 to 3, further comprising a metal or metalloid oxide layer on a surface of the metalloid element-containing layer on a side opposite to the fiber substrate side.

Item 5. The laminated sheet according to Item 4, wherein the ratio of the thickness of the oxide layer to the thickness of the metalloid element-containing layer is 0.05 or more and 1 or less.

Item 6. The laminated sheet according to Item 4 or 5, wherein the oxide layer comprises one or more compounds represented by $AO_X$, wherein X is a number satisfying the following formula: $n/2.5 \leq X \leq n/2$ (n is the valence of a metal or metalloid); and A is a metalloid element or metallic element selected from the group consisting of silicon, germanium, antimony, tellurium, bismuth, selenium, titanium, aluminum, niobium, nickel, and cobalt.

Item 7. The laminated sheet according to any one of Items 1 to 6, wherein the laminated sheet further comprises a metal layer between the metalloid element-containing layer and the fiber substrate, and the ratio of the thickness of the metalloid element-containing layer to the thickness of the metal layer is 0.01 or more and 10 or less.

Item 8. The laminated sheet according to any one of Items 1 to 7, wherein the laminated sheet comprises the fiber substrate, a metal layer, and the metalloid element-containing layer in this order; the difference in refractive index between the metalloid element-containing layer and the metal layer is 2 or more; and the metalloid element-containing layer has a thickness of 1 nm or more and 40 nm or less.

Item 9. The laminated sheet according to Item 8, wherein the difference in extinction coefficient between the metalloid element-containing layer and the metal layer is a negative value, and the absolute value thereof is 1.5 or more.

Item 10. The laminated sheet according to any one of Items 1 to 9, wherein the fiber substrate is a carbon fiber substrate.

Item 11. A coated fiber comprising a fiber and a metalloid element-containing layer disposed on or above a surface of the fiber.

Item 12. The coated fiber according to Item 11, wherein the coated fiber comprises the fiber, a metal layer disposed on a surface of the fiber, and the metalloid element-containing layer disposed on the metal layer; the difference in refractive index between the metalloid element-containing layer and the metal layer is 2 or more; and the metalloid element-containing layer has a thickness of 1 nm or more and 40 nm or less.

Item 13. A coated fiber bundle comprising a plurality of the coated fibers according to Item 11 or 12.

Item 14. A composite material comprising a resin and at least one member selected from the group consisting of the laminated sheet according to any one of Items 1 to 10, the coated fiber according to Item 11 or 12, and the coated fiber bundle according to Item 13.

Item 15. The composite material according to Item 14, which is a fiber-reinforced plastic.

Advantageous Effects of Invention

The present invention provides a laminated sheet, a coated fiber, a coated fiber bundle, and a composite material comprising at least one of these and a resin, that have luster while having a vivid color. The present invention also provides a laminated sheet, a coated fiber, a coated fiber bundle, and a composite material comprising at least one of these and a resin, in which more unevenness that the object to be colored originally has remains when the object has unevenness (for example, when a carbon fiber substrate is used).

Further, in a preferred embodiment of the present invention, provided are a laminated sheet, a coated fiber, a coated fiber bundle, and a composite material comprising at least one of these and a resin, in which more unevenness that the fiber substrate, fiber, fiber bundle, or the like originally has remains; and which have luster and a more vivid color.

DESCRIPTION OF EMBODIMENTS

In the present specification, the terms "comprise" and "contain" include the concepts of "comprise," "contain," "consist essentially of," and "consist of."

1. Laminated Sheet

In one embodiment, the present invention relates to a laminated sheet comprising a fiber substrate and a metalloid element-containing layer disposed on or above the surface of the substrate (which may be referred to as "the laminated sheet of the present invention" in the present specification). The laminated sheet is described below.

1-1. Fiber Substrate

The fiber substrate is not particularly limited, as long as it is a substrate comprising fibers or fiber bundles as a material, and is in the form of a sheet. The fiber substrate may comprise components other than fibers and fiber bundles, as long as the effects of the present invention are not significantly impaired. In this case, the total amount of fibers and fiber bundles in the fiber substrate is, for example, 80 mass % or more, preferably 90 mass % or more, more preferably 95 mass % or more, and even more preferably 99 mass % or more; and is generally less than 100 mass %. Examples of the fiber substrate include woven fabrics (e.g., plain weave, twill weave, and satin weave), knitted fabrics, nonwoven fabrics, paper, and the like. Among these, for example, woven fabrics, knitted fabrics, and the like are preferable; and woven fabrics are more preferable, in terms of the relatively large uneven shape of the surface, and more improved designability of the laminated sheet of the present invention.

The fibers constituting the fiber substrate are not particularly limited. For example, a wide variety of inorganic fibers, organic fibers, and the like can be used. Examples of inorganic fibers include carbon fibers (e.g., PAN-based carbon fibers, pitch-based carbon fibers, and carbon nanotubes); glass fibers (e.g., glass wool and glass fibers), mineral fibers (e.g., chrysotile, white asbestos, crocidolite, amosite, anthophyllite, tremolite, and actinolite); artificial mineral fibers (e.g., rock wool and ceramic fibers); metallic fibers (e.g., stainless steel fibers, aluminum fibers, iron fibers, nickel fibers, and copper fibers); and the like.

Examples of organic fibers include synthetic fibers (e.g., nylon fibers, polyester fibers, acrylic fibers, vinylon fibers, polyolefin fibers, polyethylene fibers, polypropylene fibers, and polyurethane fibers); regenerated fibers (e.g., rayon, polynosic, cupra, Lyocell, and acetate); plant fibers (e.g., cotton fibers, hemp fibers, flax fibers, rayon fibers, polynosic fibers, cupra fibers, Lyocell fibers, and acetate fibers); animal fibers (e.g., wool, silk, silkworm gut, mohair, cashmere, camel, llama, alpaca, vicuna, angora, and spider silk); and the like. Among these, the fibers are, for example, preferably inorganic fibers, more preferably carbon fibers, and even more preferably PAN-based carbon fibers.

The fiber substrate preferably comprises a carbon material as the fibers constituting the fiber substrate, or as a component other than the fibers constituting the fiber substrate. The carbon material is not particularly limited. Examples include carbon fibers (e.g., PAN-based carbon fibers, pitch-based carbon fibers, and carbon nanotubes), carbon black, activated carbon, hard carbon, soft carbon, mesoporous carbon, graphene, carbon nanotubes, fullerenes, and the like. Among these, for example, carbon fibers or carbon fiber bundles are preferable, and PAN-based carbon fibers or bundles thereof are more preferable. When the fiber substrate comprises a carbon material as a component other than the fibers constituting the fiber substrate, the fiber substrate comprises a carbon material, for example, as a component for coating the fiber surface or a component for joining fibers; however, it is not limited thereto.

The size of the fibers can vary depending on the type of fiber, and is not particularly limited. In the case of carbon fibers, for example, the average diameter is preferably about 1,000 to 30,000 nm (particularly, about 1,000 to 10,000 nm).

The form of the fibers may be any of continuous long fibers, short fibers obtained by cutting continuous long fibers, milled yarns obtained by milling fibers into a powder, etc.

The fibers may be one type of fiber, or a combination of two or more types of fibers.

The fiber bundle is not particularly limited, as long as it is composed of a plurality of fibers. The number of fibers constituting the fiber bundle is, for example, 500 or more, preferably 1000 or more, more preferably 1000 to 50000, even more preferably 1500 to 40000, and still even more preferably 2000 to 30000.

The thickness of the fiber substrate can vary depending on the type of fiber, and is not particularly limited. The thickness of the fiber substrate is, for example, 0.01 to 10 mm, and preferably 0.05 to 5 mm.

The layer structure of the fiber substrate is not particularly limited. The fiber substrate may be composed of a single fiber substrate alone, or may be a combination of two or more fiber substrates.

1-1-1. Carbonaceous Substrate

The fiber substrate is preferably a carbonaceous substrate.

The carbonaceous substrate is not particularly limited, as long as it is a substrate comprising a carbon material as a material, and is in the form of a sheet. The carbonaceous substrate may comprise components other than the carbon material, as long as the effects of the present invention are not significantly impaired. In this case, the amount of the carbon material in the carbonaceous substrate is, for example, 80 mass % or more, preferably 90 mass % or more, more preferably 95 mass % or more, and even more preferably 99 mass % or more; and is generally less than 100 mass %.

The carbon material is not particularly limited. Examples include carbon fibers (e.g., PAN-based carbon fibers, pitch-based carbon fibers, and carbon nanotubes), carbon black, activated carbon, hard carbon, soft carbon, mesoporous carbon, graphene, carbon nanotubes, fullerenes, and the like. Among these, for example, carbon fibers or carbon fiber bundles are preferable, and PAN-based carbon fibers or bundles thereof are more preferable.

The size of the carbon fibers is not particularly limited. For example, the average diameter of the carbon fibers is preferably about 1,000 to 30,000 nm (particularly, about 1,000 to 10,000 nm).

The form of the carbon fibers may be any of continuous long fibers, short fibers obtained by cutting continuous long fibers, milled yarns obtained by milling fibers into a powder, etc.

The carbon fiber bundle is not particularly limited, as long as it is composed of a plurality of fibers. The number of fibers constituting the fiber bundle is, for example, 500 or more, preferably 1000 or more, more preferably 1000 to 50000, even more preferably 1500 to 40000, and still even more preferably 2000 to 30000.

The carbon materials may be used singly, or in a combination of two or more. Specific examples of the carbonaceous substrate include carbon fiber substrates (e.g., woven fabrics such as plain weave, twill weave, and satin weave, knitted fabrics, nonwoven fabrics, and paper), graphene sheets, and the like. Among these, the carbonaceous substrate is preferably a carbonaceous substrate having unevenness, in terms of exhibiting the effects of the coloring technique of the present invention, which enables more unevenness to remain. Specifically, the carbonaceous substrate is preferably a carbon fiber substrate; more preferably a woven fabric, knitted fabric, or the like of carbon fibers; and even more preferably a woven fabric of carbon fibers.

The thickness of the carbonaceous substrate can vary depending on the type thereof, and is not particularly limited. The thickness of the carbonaceous substrate is, for example, 0.01 to 10 mm, and preferably 0.05 to 5 mm.

The layer structure of the carbonaceous substrate is not particularly limited. The carbonaceous substrate may be composed of a single carbonaceous substrate alone, or may be a combination of two or more carbonaceous substrates.

1-2. Metalloid element-containing layer

The metalloid element-containing layer is disposed on or above the fiber substrate. More specifically, the metalloid element-containing layer is disposed on the fiber substrate directly, or via one or more other layers. When the laminated sheet of the present invention comprises a metal layer described later, the metalloid element-containing layer is disposed on the metal layer. In other words, the metalloid element-containing layer is disposed on the surface of the metal layer on a side opposite to the fiber substrate side.

The metalloid element-containing layer is not particularly limited, as long as it comprises a metalloid element as a material. The metalloid element-containing layer may comprise components other than metalloid elements, as long as the effects of the present invention are not significantly impaired. In this case, the metalloid element content in the metalloid element-containing layer is, for example, 30 mass % or more, preferably 50 mass % or more, even more preferably 75 mass % or more, still even more preferably 80 mass % or more, further still even more preferably 90 mass % or more, particularly preferably 95 mass % or more, and very preferably 99 mass % or more; and is generally less than 100 mass %.

The metalloid element constituting the metalloid element-containing layer is not particularly limited. Examples include silicon, germanium, antimony, tellurium, boron, arsenic, phosphorus, bismuth, selenium, and the like. Among these, the metalloid element is preferably at least one member selected from the group consisting of silicon, germanium, antimony, tellurium, boron, phosphorus, bismuth, and selenium; more preferably at least one member selected from the group consisting of silicon, germanium, and bismuth; and even more preferably silicon, in terms of favorably adjusting the color tone of the laminated sheet.

The metalloid elements may be used singly, or in a combination of two or more.

The metalloid element-containing layer may be composed of a metal or an alloy composed of one or more metalloid elements described above, a compound containing one or more metalloid elements described above, or a mixture thereof. Examples of the metalloid element-containing compound include oxides, nitrides, carbides, nitrided oxides, and the like. Examples of the oxides include compounds represented by $MO_X$, wherein X is a number satisfying the following formula: $n/10 \leq X \leq n/2.5$ (n is the valence of a metalloid); and M is a metalloid element.

Examples of the nitrides include compounds represented by $MN_y$, wherein Y is a number satisfying the following formula: $n/100 \leq Y \leq n/3$ (n is the valence of a metalloid); and M is a metalloid element.

Examples of the carbides include compounds represented by $MC_z$, wherein Z is a number satisfying the following formula: $n/100 \leq Z \leq n/4$ (n is the valence of a metalloid); and M is a metalloid element.

Examples of the nitrided oxides include compounds represented by $MO_xN_y$, wherein X and Y satisfy the following: $n/100 \leq X$, $n/100 \leq Y$, and $X+Y \leq n/2$ (n is the valence of a metalloid); and M is a metalloid element.

Regarding the oxidation number X of the oxides or nitrided oxides, for example, elemental analysis of a cross section of a layer containing $MO_X$ or $MO_xN_y$ is performed by FE-TEM-EDX (e.g., using "JEM-ARM200F" produced by JEOL Ltd.); and X is calculated from the element ratio of M and N per area of the cross section of the layer containing $MN_y$ or $MO_xN_y$ to calculate the valence of oxygen atom.

Regarding the nitridation number Y of the nitrides or nitrided oxides, for example, elemental analysis of a cross section of a layer containing $MN_y$ or $MO_xN_y$ is performed by FE-TEM-EDX (e.g., using "JEM-ARM200F" produced by JEOL Ltd.); and Y is calculated from the element ratio of M and N per area of the cross section of the layer containing $MN_y$ or $MO_xN_y$ to calculate the valence of nitrogen atom.

Regarding the carbonization number Z of the carbides, for example, elemental analysis of a cross section of a layer containing $MC_z$ is performed by FE-TEM-EDX (e.g., using "JEM-ARM200F" produced by JEOL Ltd.); and Z is calculated from the element ratio of M and C per area of the cross section of the layer containing $MC_z$ to calculate the valence of carbon atom.

The metalloid layer preferably comprises a layer containing $MO_X$ (M represents an n-valent metalloid, and X represents a number that is 0 or more, and less than n/2); $MN_y$ (M represents an n-valent metalloid, and Y represents a number that is 0 or more, and n/3 or less); or $MC_z$ (M represents an n-valent metal or metalloid, and Z represents a number that is 0 or more, and n/4 or less). In this case, M is preferably silicon, germanium, gallium, zinc, silver, gold, titanium, aluminum, molybdenum, niobium, or indium. Among these, silicon, germanium, titanium, and the like are preferable; and silicon, germanium, and the like are more preferable, in terms of, for example, increasing the color chroma.

In terms of further increasing the color chroma, when M in $MO_x$ is silicon, X preferably represents a number less than 1, more preferably 0.5 or less, and even more preferably less than 0.5. When M in $MN_y$ is silicon, Y preferably represents a number equal to or less than 4/3. When M in $MC_z$ is silicon, Z preferably represents a number equal to or less than 1.

The thickness of the metalloid element-containing layer is not particularly limited; and is, for example, 1 nm or more and 150 nm or less. The thickness of the metalloid element-containing layer is preferably 3 nm or more, more preferably 5 nm or more, even more preferably 6 nm or more, and still even more preferably 8 nm or more, in terms of achieving more vivid color development. The upper limit of the thickness of the metalloid element-containing layer is preferably 100 nm, more preferably 70 nm, even more preferably 60 nm, and still even more preferably 50 nm.

From another viewpoint (in particular, in the case where the sheet further comprises a metal layer described later, and has optical characteristics described later), the thickness of the metalloid element-containing layer is preferably 1 nm or more, and 40 nm or less. When the thickness of the metalloid element-containing layer is in this range, more vivid color development can be achieved. In terms of achieving more vivid color development, the thickness of the metalloid element-containing layer is preferably 5 nm or more, and more preferably 10 nm or more. The upper limit of the thickness of the metalloid element-containing layer is preferably 30 nm, and more preferably 25 nm, in terms of achieving more vivid color development.

The layer structure of the metalloid element-containing layer is not particularly limited. The metalloid element-containing layer may be a single layer composed of one layer, or may be composed of a plurality of layers having the same or different compositions. Moreover, one or both of the two main surfaces of the metalloid element-containing layer may be composed of a film such as an oxide film.

1-3. Metal Layer

The laminated sheet of the present invention preferably further comprises a metal layer between the metalloid element-containing layer and the fiber substrate. Use of a metal layer further improves luster, discoloration resistance, color vividness, and the like. When the laminated sheet of the present invention comprises a metal layer, the metal layer is disposed on the fiber substrate. In other words, the metal layer is disposed on at least one of the two main surfaces of the fiber substrate.

The metal layer is not particularly limited, as long as it is a layer comprising a metal as a material. The metal layer may comprise components other than metal, as long as the effects of the present invention are not significantly impaired. In this case, the amount of the metal in the metal layer is, for example, 80 mass % or more, preferably 90 mass % or more, more preferably 95 mass % or more, and even more preferably 99 mass % or more; and is generally less than 100 mass %.

The metal constituting the metal layer is not particularly limited. Examples include silver, aluminum, titanium, copper, gallium, zinc, silver, gold, tin, iron, molybdenum, niobium, nickel, chromium, indium, and the like. Among these, silver, aluminum, titanium, and the like are preferable; silver, aluminum, and the like are more preferable; and silver is even more preferable, in terms of, for example, readily obtaining a difference in refractive index that is above a certain level between the metal layer and the metalloid element-containing layer, and achieving color vividness.

The metals may be used singly, or in a combination of two or more.

The thickness of the metal layer is not particularly limited; and is, for example, 1 nm or more and 200 nm or less. The lower limit of the thickness of the metal layer is preferably 5 nm, more preferably 10 nm, even more preferably 20 nm, still even more preferably 25 nm, and particularly preferably 30 nm, in terms of luster, color vividness, and the like. The upper limit of the thickness of the metal layer is preferably 100 nm, more preferably 80 nm, even more preferably 70 nm, still even more preferably 60 nm, and particularly preferably 60 nm, in terms of luster, color vividness, and the like.

Moreover, the thickness of the metal layer is preferably 5 to 100 nm, more preferably 10 to 80 nm, even more preferably 20 to 70 nm, still even more preferably 25 to 60 nm, particularly preferably 28 to 60 nm, and very preferably 30 to 32 nm, in terms of further reducing the influence of metal reflection on the underlayer (fiber substrate) and making interference with the metalloid element-containing layer to an appropriate degree to enable more vivid color development.

When the laminated sheet of the present invention comprises a metal layer, the lower limit of the ratio of the thickness of the metalloid element-containing layer to the thickness of the metal layer (i.e., the thickness of the metalloid element-containing layer/the thickness of the metal layer) is not particularly limited; and is preferably 0.01, more preferably 0.05, even more preferably 0.1, still even more preferably 0.2, and particularly preferably 0.4, in terms of luster, color vividness, and the like. The upper limit of the thickness ratio is not particularly limited; and is preferably 10, more preferably 5, even more preferably 2, still even more preferably 1, and particularly preferably 0.8, in terms of luster, color vividness, and the like.

The layer structure of the metal layer is not particularly limited. The metal layer may be a single layer composed of one layer, or composed of a plurality of layers having the same or different compositions. Moreover, one or both of the two main surfaces of the metal layer may be composed of a film such as an oxide film.

1-4. Metal or Metalloid Oxide Layer

The laminated sheet of the present invention preferably further comprises an oxide layer on the surface of the metalloid element-containing layer on a side opposite to the fiber substrate side. Use of an oxide layer further improves discoloration resistance, fastness to rubbing, and the like.

The oxide layer is not particularly limited, as long as it comprises an oxide of a metal or a metalloid as a material. The oxide layer may comprise components other than the oxide, as long as the effects of the present invention are not significantly impaired. In this case, the amount of the oxide in the oxide layer is, for example, 80 mass % or more, preferably 90 mass % or more, more preferably 95 mass % or more, and even more preferably 99 mass % or more; and is generally less than 100 mass %.

The metalloid oxide constituting the oxide layer is not particularly limited. Examples include oxides of metalloids, such as silicon, germanium, antimony, tellurium, bismuth, and selenium (preferably silicon). More specific examples of the metalloid oxide include compounds represented by $AO_X$, wherein X is a number satisfying the following formula: $n/2.5 \leq X \leq n/2$ (n is the valence of a metalloid); and A is a metalloid selected from the group consisting of silicon, germanium, antimony, tellurium, bismuth, and selenium. When A in the above formula is a metalloid element, A is preferably silicon; and the metalloid oxide is more preferably $SiO_2$, in terms of favorably adjusting the color tone of the laminated sheet. The metalloid oxides may be used singly, or in a combination of two or more.

The metal oxide constituting the oxide layer is not particularly limited. Examples include oxides of metals, such as titanium, aluminum, niobium, cobalt, and nickel (preferably titanium and aluminum). More specific examples of the metal oxide include compounds represented by $AO_X$, wherein X is a number satisfying the following formula: $n/2.5 \leq X \leq n/2$ (n is the valence of a metal); and A is a metal selected from the group consisting of titanium, aluminum, niobium, cobalt, and nickel. When A in the above formula is a metallic element, A is preferably titanium or aluminum;

and the metal oxide is more preferably AZO, $TiO_2$, or $Al_2O_5$, in terms of favorably adjusting the color tone of the laminated sheet. The metal oxides may be used singly, or in a combination of two or more.

In terms of further improving, for example, the discoloration resistance and fastness to rubbing of the laminated sheet, X in the above formula is preferably n/2.4 or more and n/2 or less, more preferably n/2.3 or more and n/2 or less, even more preferably n/2.2 or more and n/2 or less, and particularly preferably n/2.1 or more and n/2 or less.

The thickness of the oxide layer is not particularly limited; and is, for example, 1 nm or more and 100 nm or less. In terms of discoloration resistance, fastness to rubbing, and the like, the thickness of the oxide layer is preferably 2 or more and 50 nm or less, more preferably 5 or more and 40 nm or less, and even more preferably 8 or more and 30 nm or less.

The ratio of the thickness of the oxide layer to the thickness of the metalloid element-containing layer (i.e., the thickness of the oxide layer/the thickness of the metalloid element-containing layer) is not particularly limited; and is preferably 0.05 or more and 2 or less, more preferably 0.05 or more and 1.5 or less, even more preferably 0.05 or more and 1 or less, and still even more preferably 0.1 or more and 1 or less, in terms of discoloration resistance, fastness to rubbing, and the like.

The layer structure of the oxide layer is not particularly limited. The oxide layer may be a single layer composed of one layer, or may be composed of a plurality of layers having the same or different compositions.

1-5. Optical Characteristics

The laminated sheet of the present invention is preferably a laminated sheet comprising a fiber substrate, a metal layer, and a metalloid element-containing layer in this order, wherein the difference in refractive index between the metalloid element-containing layer and the metal layer is 2 or more, and the metalloid element-containing layer has a thickness of 1 nm or more and 40 nm or less. When the difference in refractive index between the metalloid element-containing layer and the metal layer (i.e., the refractive index of the metalloid element-containing layer minus the refractive index of the metal layer) in the laminated sheet of the present invention is 2 or more, more vivid color development can be achieved. The difference in refractive index is preferably 2 or more and 8 or less, more preferably 3 or more and 6 or less, and even more preferably 3 or more and 5 or less.

The difference in refractive index is a difference in refractive index at the minimum value (bottom wavelength) in and near the visible range (wavelength: 300 nm or more and 800 nm or less) in a reflection spectrum obtained by measuring the reflectance including specular reflection of the film-forming surface of the laminated sheet (i.e., the refractive index of the metalloid element-containing layer minus the refractive index of the metal layer). The refractive index can be calculated using known analysis software (WVASE32, produced by J. A. Woollam; or an equivalent thereof).

In the laminated sheet of the present invention, the difference in extinction coefficient between the metalloid element-containing layer and the metal layer (i.e., the extinction coefficient of the metalloid element-containing layer minus the extinction coefficient of the metal layer) is preferably a negative value, in terms of achieving more vivid color development. Moreover, from the same viewpoint, it is preferred that the negative value have a larger absolute value. The absolute value is preferably 1 or more, more preferably 1.5 or more, even more preferably 2 or more, still even more preferably 3 or more, and particularly preferably 4 or more. The upper limit of the absolute value is not particularly limited; and is, for example, 10, 8, or 7.

The difference in extinction coefficient is a difference in extinction coefficient at the minimum value (bottom wavelength) in and near the visible range (wavelength: 300 nm or more and 800 nm or less) in a reflection spectrum obtained by measuring the reflectance including specular reflection of the film-forming surface of the laminated sheet (i.e., the extinction coefficient of the metalloid element-containing layer, minus the extinction coefficient of the metal layer). The extinction coefficient can be calculated using known analysis software (WVASE32, produced by J. A. Woollam; or an equivalent thereof).

In the laminated sheet of the present invention, the bottom wavelength is preferably 300 nm or more and 700 nm or less, more preferably 400 nm or more and 600 nm or less, and even more preferably 450 nm or more and 600 nm or less, in terms of achieving more vivid color development.

The bottom wavelength is the minimum value in and near the visible range (wavelength: 300 to 800 nm) in a reflection spectrum obtained by measuring the reflectance including the specular reflection of the film-forming surface of the laminated sheet.

1-6. Production Method

Although there is no particular limitation, the laminated sheet of the present invention can be obtained, for example, by the steps of: (1) attaching a metalloid element-containing layer to the surface of a fiber substrate or (2) attaching a metal layer to the surface of a fiber substrate, and attaching a metalloid element-containing layer to the surface of the metal layer on a side opposite to the fiber substrate side; and/or (3) attaching an oxide layer to the surface of the metalloid element-containing layer on a side opposite to the fiber substrate side, in addition to (1) or (2).

Although there is no particular limitation, the attachment can be performed by, for example, a sputtering method, a vacuum deposition method, an ion plating method, a chemical vapor deposition method, a pulsed laser deposition method, or like method. Among these, a sputtering method is preferable, in terms of film thickness controllability.

The sputtering method is not particularly limited. Examples include direct current magnetron sputtering, radio-frequency magnetron sputtering, ion beam sputtering, and the like. Further, the sputtering apparatus may be of a batch type, or a roll-to-roll type.

2. Coated Fiber and Coated Fiber Bundle

In one embodiment, the present invention relates to a coated fiber comprising a fiber and a metalloid element-containing layer disposed on the surface of the fiber. In one embodiment, the present invention also relates to a coated fiber comprising a fiber, a metal layer disposed on or above the surface of the fiber, and a metalloid element-containing layer disposed on the metal layer, wherein the difference in refractive index between the metalloid element-containing layer and the metal layer is 2 or more, and the metalloid element-containing layer has a thickness of 1 nm or more and 40 nm or less. In the present specification, these may be collectively referred to as "the coated fiber of the present invention." Further, in one embodiment, the present invention relates to a coated fiber bundle comprising a plurality of the coated fibers of the present invention (which may be referred to as "the coated fiber bundle of the present invention" in the present specification). The coated fiber and coated fiber bundle are described below.

The coated fiber of the present invention preferably further comprises a metal layer between the metalloid element-containing layer and the fiber. In this case, in the coated fiber of the present invention, the metalloid element-containing layer is disposed on the metal layer. In other words, the metalloid element-containing layer is disposed on the surface of the metal layer on a side opposite to the fiber substrate side. The coated fiber of the present invention preferably further comprises an oxide layer on the surface of the metalloid element-containing layer on a side opposite to the fiber substrate side.

The fiber, fiber bundle, metal layer, metalloid element-containing layer, oxide layer, optical characteristics, production method, and the like are the same as described above in the section "1. Laminated sheet."

In one embodiment of the coated fiber of the present invention, the metalloid element-containing layer is disposed on at least a part (for example, 30% or more, preferably 50% or more, more preferably 70% or more, and generally 100% or less, of the total surface area) or the entire surface of the fiber. Likewise, in one embodiment of the coated fiber of the present invention, the metal layer is disposed on at least a part (for example, 30% or more, preferably 50% or more, more preferably 70% or more, and generally 100% or less, of the total surface area) or the entire surface of the fiber.

The laminated sheet of the present invention can be formed by at least one member selected from the group consisting of the coated fiber of the present invention and the coated fiber bundle of the present invention, alone or in combination with at least one member selected from the group consisting of other fibers and fiber bundles. The other fibers are not particularly limited; for example, a wide variety of inorganic fibers, organic fibers, and the like can be used.

Examples of inorganic fibers include glass fibers (e.g., glass wool and glass fibers), mineral fibers (e.g., chrysotile, white asbestos, crocidolite, amosite, anthophyllite, tremolite, and actinolite), artificial mineral fibers (e.g., rock wool and ceramic fibers), metallic fibers (e.g., stainless steel fibers, aluminum fibers, iron fibers, nickel fibers, and copper fibers), and the like.

Examples of organic fibers include synthetic fibers (e.g., nylon fibers, polyester fibers, acrylic fibers, vinylon fibers, polyolefin fibers, polyethylene fibers, polypropylene fibers, and polyurethane fibers); regenerated fibers (e.g., rayon, polynosic, cupra, Lyocell, and acetate); plant fibers (e.g., cotton fibers, hemp fibers, flax fibers, rayon fibers, polynosic fibers, cupra fibers, Lyocell fibers, and acetate fibers); animal fibers (e.g., wool, silk, silkworm gut, mohair, cashmere, camel, llama, alpaca, vicuna, angora, and spider silk); and the like.

3. Use

The laminated sheet of the present invention, the coated fiber of the present invention, and the coated fiber bundle of the present invention are those which have luster while having a vivid color; and in which, when an object to be colored has unevenness (for example, when a carbon fiber substrate is used), more unevenness that it originally has remains. Thus, they can be used as a fiber substrate with further improved designability in various fields; for example, as a composite material of a fiber substrate and a resin.

In a preferred embodiment of the present invention, the laminated sheet of the present invention, the coated fiber of the present invention, and the coated fiber bundle of the present invention are those in which more unevenness that the fiber substrate, the fiber, the fiber bundle, etc., originally have remains; and which have luster and a more vivid color. Thus, they can be used as a fiber material with further improved designability in various fields; for example, as a composite material of a fiber and a resin.

From this viewpoint, in one embodiment, the present invention relates to a composite material(which may be referred to as "the composite material of the present invention" in the present specification) comprising at least one member selected from the group consisting of the laminated sheet of the present invention, the coated fiber of the present invention, and the coated fiber bundle of the present invention (hereinafter, these are collectively referred to as "the fiber material of the present invention"); and a resin. The composite material is described below.

The composite material of the present invention is not particularly limited, as long as it comprises the fiber material of the present invention and a resin. The composite material of the present invention is preferably a fiber-reinforced plastic in which the fiber material of the present invention is contained in a resin, which is a base material.

The resin is not particularly limited, and various resins can be used. Examples of the resin include polyamide-based resins (e.g., nylon), polyphenylene ethers, polyoxymethylene, polybutylene terephthalate, polycarbonate, polymethyl methacrylate (PMMA), polystyrene, polypropylene, polyetherimide, polyvinyl chloride, polyethersulfone, and the like.

The composite material of the present invention can be produced according to a usual method; and can be used in various applications, such as structural materials for producing automobiles, aircraft, sports-related products (e.g., golf shafts, tennis rackets, badminton rackets, fishing rods, skis, snowboards, bats, archery, bicycles, boats, canoes, yachts, and windsurfing), medical devices, building members, electrical equipment (e.g., cases of personal computers and the like, and speaker cones), and the like.

EXAMPLES

Examples are given below to illustrate the present invention in more detail; however, the present invention is not limited to the Examples.

(1) Production of Laminated Sheet

Example 1

A twill-woven fabric ("TR3523 M," produced by Mitsubishi Chemical Corporation; thickness: 0.21 mm), which is made from carbon fibers (areal weight: 200 g/m$^2$, filament diameter: 7 μm, density: 12.5 fibers/inch), was used as a fiber substrate.

The fiber substrate was placed in a vacuum apparatus, followed by evacuation to $5.0 \times 10^{-4}$ Pa or less. Subsequently, argon gas was introduced, and an Si layer (average thickness: 30 nm) was formed on the surface of the fiber substrate as a metalloid element-containing layer by the DC magnetron sputtering method, thereby obtaining a laminated sheet.

Example 2

The fiber substrate used in Example 1 was placed in a vacuum apparatus, followed by evacuation to $5.0 \times 10^{-4}$ Pa or less. Subsequently, argon gas was introduced, and an Si layer (average thickness: 50 nm) was formed on the surface of the fiber substrate as a metalloid element-containing layer by the DC magnetron sputtering method, thereby obtaining a laminate comprising the fiber substrate and the metalloid element-containing layer.

The laminate comprising the fiber substrate and the metalloid element-containing layer was placed in a vacuum apparatus, followed by evacuation to $5.0 \times 10^{-4}$ Pa or less. Subsequently, argon gas was introduced, and an $SiO_2$ layer (average thickness: 2 nm) was formed on the surface of the metalloid element-containing layer on a side opposite to the fiber substrate side as an oxide layer by the DC magnetron sputtering method, thereby obtaining a laminated sheet.

Example 3

A laminated sheet was obtained in the same manner as in Example 2, except that an Si layer (average thickness: 30 nm) was formed as a metalloid element-containing layer, and an $SiO_2$ layer (average thickness: 30 nm) was formed as an oxide layer.

Example 4

A laminated sheet was obtained in the same manner as in Example 2, except that an Si layer (average thickness: 30 nm) was formed as a metalloid element-containing layer, and an $SiO_2$ layer (average thickness: 10 nm) was formed as an oxide layer.

Example 5

A laminated sheet was obtained in the same manner as in Example 2, except that an Si layer (average thickness: 30 nm) was formed as a metalloid element-containing layer, and a $TiO_2$ layer (average thickness: 3 nm) was formed as an oxide layer.

Example 6

The fiber substrate used in Example 1 was placed in a vacuum apparatus, followed by evacuation to $5.0 \times 10^{-4}$ Pa or less. Subsequently, argon gas was introduced; and an Al layer (average thickness: 50 nm) was formed on the surface of the fiber substrate as a metal layer by the DC magnetron sputtering method, thereby obtaining a laminate comprising the fiber substrate and the metal layer.

The laminate comprising the fiber substrate and the metal layer was placed in a vacuum apparatus, followed by evacuation to $5.0 \times 10^{-4}$ Pa or less. Subsequently, argon gas was introduced, and an Si layer (average thickness: 30 nm) was formed on the surface of the metal layer on a side opposite to the fiber substrate side as a metalloid element-containing layer by the DC magnetron sputtering method, thereby obtaining a laminated sheet.

Example 7

A laminated sheet was obtained in the same manner as in Example 6, except that a Ti layer (average thickness: 50 nm) was formed as a metal layer. The obtained laminated sheet was placed in a vacuum apparatus, followed by evacuation to $5.0 \times 10^{-4}$ Pa or less. Subsequently, argon gas was introduced, and an $SiO_2$ layer (average thickness: 5 nm) was formed on the surface of the metalloid element-containing layer on a side opposite to the fiber substrate side as an oxide layer by the DC magnetron sputtering method, thereby obtaining a laminated sheet.

Examples 8 to 10 and 13 to 15

Laminated sheets were obtained in the same manner as in Example 6, except that the metal forming the metal layer, the thickness of the metal layer, and the thickness of the metalloid layer shown in Tables 1 and 2 were adopted.

Example 11

A laminated sheet was obtained in the same manner as in Example 15, except that a polyester fiber substrate ("Amina BF-4624" produced by Masuda Co., Ltd.), which is a circular knitted fabric, was used as a fiber substrate.

Example 12

A laminated sheet was obtained in the same manner as in Example 15, except that a polyester fiber substrate ("Hikaru Genji TM-3001 E21" produced by Masuda Co., Ltd.), which is a plain-woven fabric made from black polyester (30 denier), was used as a fiber substrate.

Example 16

A laminated sheet was obtained in the same manner as in Example 7, except that a polyester fiber substrate ("Hikaru Genji TM-3001 E21" produced by Masuda Co., Ltd.), which is a plain-woven fabric made from black polyester (30 denier), was used as a fiber substrate, and the metalloid layer, the metal layer, and the oxide layer shown in Table 2 were used.

Comparative Example 1

A paint containing a blue pigment was applied to one side of the fiber substrate used in Example 1 to form a colored layer (a layer that does not transmit light; average thickness: 15 μm), thereby obtaining a laminated sheet.

Comparative Example 2

The fiber substrate used in Example 1 was placed in a vacuum apparatus, followed by evacuation to $5.0 \times 10^{-4}$ Pa or less. Subsequently, argon gas was introduced, and a Ti layer (average thickness: 50 nm) was formed on the surface of the fiber substrate as a metal layer by the DC magnetron sputtering method, thereby obtaining a laminated sheet comprising the fiber substrate and the metal layer.

Comparative Example 3

The polyester fiber substrate used in Example 16 ("Hikaru Genji TM-3001 E21" produced by Masuda Co., Ltd.), which is a plain-woven fabric made from black polyester (30 denier), was evaluated.

(2) Evaluation 1
Evaluation of Texture

When the surface of each laminated sheet was observed, it was visually confirmed whether the uneven shape (surface pattern) of the carbon fibers used for the fiber substrate was not deteriorated, and whether the surface pattern was visually recognized.

Criteria for Texture
A: The uneven shape was not deteriorated (no change from carbon fibers).
B: The uneven shape was deteriorated (different from carbon fibers).

Evaluation of Luster

When the surface of each laminated sheet and the surface of each fiber substrate were observed, it was visually confirmed whether they had metallic luster.

Criteria for Metallic Luster
A: Considerable metallic luster
B: Metallic luster
C: Slight metallic luster
D: No metallic luster Measurement of Discoloration Resistance The $L^*$, $a^*$, and $b^*$ in the $L^*a^*b^*$ color system of the surface of each laminated sheet and the surface of each fiber substrate were determined using a spectrophotometer ("CM-2500d," produced by Konica Minolta, Inc.) according to JIS Z8781-4 (2013). After the measurement, each laminated sheet was placed in a high-temperature and high-humidity chamber, and allowed to stand under the conditions of 85° C./85% for 240 hours. Thereafter, the $L^*$, $a^*$, and $b^*$ in the $L^*a^*b^*$ color system of the surface was measured in the same manner. From the $L^*$, $a^*$, and $b^*$ before and after the high-temperature and high-humidity test, the color difference $\Delta E^*ab$ in the $L^*a^*b^*$ color system of the surface of the laminated sheet was determined according to JIS Z8781-4 (2013).

Evaluation of Fastness to Rubbing

The fastness to rubbing of each laminated sheet was measured using a Rubbing Tester for Colour Fastness (produced by Daiei Kagaku Seiki MFG. Co., Ltd.) according to JIS L 0849. Wet conditions were used as the test conditions.

Evaluation of Vividness

The $L^*$, $a^*$, and $b^*$ in the $L^*a^*b^*$ color system of the surface of each laminated sheet and the surface of each fiber substrate were determined using a spectrophotometer ("CM-2500d" produced by Konica Minolta, Inc.) according to JIS Z8781-4 (2013).

Chroma $C^*$ was used as an index of vividness.
$C^* = \sqrt{(a^{*2} + b^{*2})}$ Tables 1 and 2 show the results.

TABLE 1

| | | Example | | | | | | | | | |
|---|---|---|---|---|---|---|---|---|---|---|---|
| | | 1 | 2 | 3 | 4 | 5 | 6 | 7 | 8 | 9 | 10 |
| Substrate | | Carbon fibers | Carbon fibers | Carbon fibers | Carbon fibers | Carbon fibers | Carbon fibers | Carbon fibers | Carbon fibers | Carbon fibers | Carbon fibers |
| Metalloid layer | Thickness | 30 | 50 | 30 | 30 | 30 | 30 | 30 | 17 | 18 | 20 |
| | Type | Si | Si | Si | Si | Si | Si | Si | Si | Si | Si |
| Oxide layer | Thickness | — | 2 | 30 | 10 | 3 | — | 5 | — | — | — |
| | Type ($AO_x$) | — | $SO_2$ | $SiO_2$ | $SiO_2$ | $TiO_2$ | — | $SiO_2$ | — | — | — |
| Ratio of thickness of oxide layer to thickness of metalloid layer | | — | 0.04 | 1 | 0.33 | 0.1 | — | 0.17 | — | — | — |
| Metal layer | Thickness | — | — | — | — | — | 50 | 50 | 20 | 25 | 30 |
| | Type | — | — | — | — | — | Al | Ti | Al | Al | Al |
| Thickness of metalloid layer/thickness of metal layer | | — | — | — | — | — | 0.6 | 0.6 | 0.85 | 0.72 | 0.67 |
| Texture | | A | A | A | A | A | A | A | A | A | A |
| Luster | | C | C | C | C | C | A | B | A | A | A |
| Discoloration resistance | | 2.8 | 1.5 | 0.6 | 0.7 | 0.9 | 1.9 | 0.9 | 2.3 | 2.4 | 2.1 |
| Fastness to rubbing (JIS L 0849): grade | | 3 | 3 | 4 | 4 | 3 | 3 | 4 | 3 | 3 | 3 |
| Vividness [$\sqrt{(a^{*2} + b^{*2})}$] | | 16 | 12 | 17 | 15 | 18 | 34 | 22 | 41.8 | 48.5 | 58.5 |

TABLE 2

| | | Example | | | | | | Comparative Example | | |
|---|---|---|---|---|---|---|---|---|---|---|
| | | 11 | 12 | 13 | 14 | 15 | 16 | 1 | 2 | 3 |
| Substrate | | Knitted fabric | Woven fabric | Carbon fibers | Carbon fibers | Carbon fibers | Woven fabric | Carbon fibers | Carbon fibers | Woven fabric |
| Metalloid layer | Thickness | 20 | 20 | 50 | 10 | 45 | 20 | Blue paint | — | Black dyeing |
| | Type | Si | Si | Si | Si | Si | Si | | — | |
| Oxide layer | Thickness | — | — | — | — | — | 5 | | | — |
| | Type ($AO_x$) | — | — | — | — | — | $SiO_2$ | | | — |
| Ratio of thickness of oxide layer to thickness of metalloid layer | | — | — | — | — | — | 0.25 | | | — |
| Metal layer | Thickness | 30 | 30 | 25 | 30 | 30 | 30 | | 50 | |
| | Type | Al | Al | Nb | Nb | Al | Al | | Ti | |
| Thickness of metalloid layer/thickness of metal layer | | 0.67 | 0.67 | 2 | 0.33 | 1.5 | 0.67 | | — | |
| Texture | | A | A | A | A | A | A | B | A | A |
| Luster | | A | A | C | C | A | A | D | C | D |
| Discoloration resistance | | 2.9 | 2.7 | 1.7 | 1.8 | 1.7 | 2.2 | 0.5 | 1.7 | 0.7 |
| Fastness to rubbing (JIS L 0849): grade | | 2-3 | 2-3 | 3 | 3 | 3 | 2-3 | 1 | 3 | 3 |
| Vividness [$\sqrt{(a^{*2} + b^{*2})}$] | | 19.37 | 33.22 | 1.8 | 3.7 | 7.8 | 33.53 | 35 | 1 | 1.52 |

The laminated sheets of Examples 1 to 16 had intact texture while having a vivid color; and also had luster, compared with the laminated sheets of Comparative Examples 1 to 3.

(3) Evaluation 2

The following measurements were performed for Examples 6 to 16.

Measurement of Bottom Wavelength

Each laminated sheet was cut into a 5 cm square, and the reflectance including specular reflection of the film-forming surface was measured with a spectrophotometer (V-670 with integrating sphere unit ISN-723, produced by JASCO Corporation). The minimum value in and near the visible range (wavelength: 300 to 800 nm) in the obtained reflection spectrum was defined as the bottom wavelength.

Difference in Refractive Index and Difference in Extinction Coefficient

The difference in refractive index (i.e., the refractive index of the metalloid element-containing layer minus the refractive index of the metal layer) and the difference in extinction coefficient (i.e., the extinction coefficient of the metalloid element-containing layer, minus the extinction coefficient of the metal layer) at the bottom wavelength in the obtained reflection spectrum were calculated. As the values of the refractive index and the extinction coefficient, those of the material library of ellipsometry analysis software (WVASE32, produced by J. A. Woollam) were used.

Measurement of reflection a* and reflection b*, and evaluation of vividness

Color calculation in the L*a*b* color system was performed using the obtained reflection spectrum with a VWCD-790 color diagnosis program installed in the spectrophotometer. The calculation conditions were as follows: light source: D65, viewing angle: 10°, and data interval: 5 nm. The obtained values of a* and b* were defined as reflection a* and reflection b*.

Moreover, the square root of the sum of the squares of reflection a* and reflection b* ($[\sqrt{(a^{*2}+b^{*2})}]$), which is called "chroma," was calculated as an index of color vividness.

Table 3 shows the results.

The invention claimed is:

1. A laminated sheet comprising a fiber substrate, a metalloid element-containing layer disposed directly on a surface of the fiber substrate, and a metal or metalloid oxide layer on a surface of the metalloid element-containing layer on a side opposite to the fiber substrate side,
   the fiber substrate being in the form of a sheet,
   the fiber substrate having a thickness of 0.01 to 10 mm,
   the fiber substrate being at least one member selected from the group consisting of a woven fabric, a knitted fabric, and a nonwoven fabric, and
   the metal or metalloid oxide layer comprising one or more compounds represented by $AO_X$,
   wherein X is a number satisfying the following formula: $n/2.5 \leq X \leq n/2$,
   wherein n is the valence of a metal or metalloid, and
   wherein A is a metalloid element or metallic element selected from the group consisting of silicon, germanium, antimony, tellurium, bismuth, selenium, titanium, aluminum, niobium, nickel, and cobalt.

2. The laminated sheet according to claim 1, wherein the fiber substrate is a carbonaceous substrate.

3. The laminated sheet according to claim 1, wherein the metalloid element constituting the metalloid element-containing layer is at least one member selected from the group consisting of silicon, germanium, antimony, tellurium, boron, phosphorus, bismuth, and selenium.

4. The laminated sheet according to claim 1, wherein the ratio of the thickness of the oxide layer to the thickness of the metalloid element-containing layer is 0.05 or more and 1 or less.

5. A laminated sheet comprising:
   a fiber substrate,
   a metal layer, and
   a metalloid element-containing layer,
   wherein the metal layer is between the metalloid element-containing layer and the fiber substrate,
   wherein the fiber substrate is in the form of a sheet,
   wherein the fiber substrate has a thickness of 0.01 to 10 mm,

TABLE 3

| | Example | | | | | | | | | | |
|---|---|---|---|---|---|---|---|---|---|---|---|
| | 6 | 7 | 8 | 9 | 10 | 11 | 12 | 13 | 14 | 15 | 16 |
| Substrate | Carbon fibers | Carbon fibers | Carbon fibers | Carbon fibers | Carbon fibers | Knitted fabric | Woven fabric | Carbon fibers | Carbon fibers | Carbon fibers | Woven fabric |
| Thickness of metalloid oxide layer | None | SiO$_2$ 5 nm | None | None | None | None | None | None | None | None | SiO$_2$ 5 nm |
| Difference in refractive index | 1.09 | 1.05 | 3.57 | 3.53 | 3.39 | 3.83 | 3.58 | 1.79 | 1.63 | 3.81 | 3.58 |
| Thickness of metalloid | a-Si 30 nm | a-Si 30 nm | a-Si 17 nm | a-Si 18 nm | a-Si 20 nm | a-Si 20 nm | a-Si 20 nm | a-Si 50 nm | a-Si 10 nm | a-Si 45 nm | a-Si 20 nm |
| Difference in extinction coefficient | −3.18 | −3.19 | −5.52 | −5.64 | −6.03 | −4.35 | −5.48 | −1.43 | −3.01 | −2.81 | −5.48 |
| Thickness of metal layer | Al 50 nm | Ti 50 nm | Al 20 nm | Al 25 nm | Al 30 nm | Al 30 nm | Al 30 nm | Nb 25 nm | Nb 30 nm | Al 30 nm | Al 30 nm |
| Bottom wavelength | 670 nm | 800 nm | 527 nm | 534 nm | 555 nm | 470 nm | 525 nm | 461 nm | 761 nm | 406 nm | 525 nm |
| Reflection a* | −16.5 | −14.2 | 40.52 | 45.29 | 45.12 | 11.64 | 33.11 | −0.54 | 0.54 | −3.92 | 32.9 |
| Reflection b* | −29.1 | −16.5 | −10.23 | −17.28 | −37.27 | 15.49 | −2.68 | 1.75 | −3.69 | 6.70 | −6.47 |
| Evaluation of vividness $[\sqrt{a^{*2} + b^{*2}}]$ | 34 | 22 | 41.8 | 48.5 | 58.5 | 19.37 | 33.22 | 1.8 | 3.7 | 7.8 | 33.53 |

The results showed that the laminated sheets of Examples 6, 8 to 12, and 16 had significantly greater color vividness than the laminated sheets of Examples 7, 9, and 13 to 15.

wherein the fiber substrate is at least one member selected from the group consisting of a woven fabric, a knitted fabric, and a nonwoven fabric, wherein the ratio of the thickness of the metalloid element-containing layer to the thickness of the metal layer is 0.01 or more and 10 or less, wherein the laminated sheet further comprises a metal or metalloid oxide layer on a surface of the metalloid element-containing layer on a side opposite to the fiber substrate side, and wherein the metal or metalloid oxide layer comprises one or more compounds represented by $AO_X$, wherein X is a number satisfying the following formula: $n/2.5 \leq X \leq n/2$, wherein n is the valence of a metal or metalloid, and wherein A is a metalloid element or metallic element selected from the group consisting of silicon, germanium, antimony, tellurium, bismuth, selenium, titanium, aluminum, niobium, nickel, and cobalt.

6. The laminated sheet according to claim 5, wherein the difference in refractive index between the metalloid element-containing layer and the metal layer is 2 or more; and the metalloid element-containing layer has a thickness of 1 nm or more and 40 nm or less.

7. The laminated sheet according to claim 6, wherein the difference in extinction coefficient between the metalloid element-containing layer and the metal layer is a negative value, and the absolute value thereof is 1.5 or more.

8. The laminated sheet according to claim 1, wherein the fiber substrate is a carbon fiber substrate.

9. A composite material comprising a resin and the laminated sheet according to claim 1.

10. The composite material according to claim 9, which is a fiber-reinforced plastic.

11. The laminated sheet according to claim 1, wherein the thickness of the fiber substrate is 0.05 to 10 mm.

12. The laminated sheet according to claim 1, wherein the oxide layer comprises silicon.

13. The laminated sheet according to claim 1, wherein the oxide layer comprises $SiO_2$.

14. The laminated sheet according to claim 8, wherein the carbon fiber substrate comprises carbon fibers having an average diameter of 1,000 to 30,000 nm.

15. The laminated sheet according to claim 1, wherein the laminated sheet has a Chroma C* value of 19.37 or more as measured according to JIS Z8781-4 (2013).

16. The laminated sheet according to claim 1, wherein the thickness of the metalloid element-containing layer is 1 nm or more and 100 nm or less.

17. A laminated sheet comprising a fiber substrate, a metalloid element-containing layer disposed directly on a surface of the fiber substrate, and a metal or metalloid oxide layer on a surface of the metalloid element-containing layer on a side opposite to the fiber substrate side, the fiber substrate being in the form of a sheet, the fiber substrate having a thickness of 0.01 mm to 10 mm, the fiber substrate being at least one member selected from the group consisting of a woven fabric and a knitted fabric, and the metal or metalloid oxide layer comprising one or more compounds represented by $AO_X$, wherein X is a number satisfying the following formula: $n/2.5 \leq X \leq n/2$, wherein n is the valence of a metal or metalloid, and wherein A is a metalloid element or metallic element selected from the group consisting of silicon, germanium, antimony, tellurium, bismuth, selenium, titanium, aluminum, niobium, nickel, and cobalt.

* * * * *